United States Patent [19]

Enstrom

[11] Patent Number: 4,703,718
[45] Date of Patent: Nov. 3, 1987

[54] VAPOR DEPOSITION APPARATUS AND METHOD OF USING SAME

[75] Inventor: Ronald E. Enstrom, Skillman, N.J.

[73] Assignee: RCA Corporation, Princeton, N.J.

[21] Appl. No.: 802,744

[22] Filed: Nov. 29, 1985

[51] Int. Cl.⁴ ............................................. C23C 16/00
[52] U.S. Cl. ................................. 118/715; 118/725; 427/255.2
[58] Field of Search ............................. 118/715, 725; 427/255.2

[56] References Cited

U.S. PATENT DOCUMENTS

| | | | |
|---|---|---|---|
| 4,103,042 | 7/1978 | Winters | 427/38 |
| 4,368,098 | 1/1983 | Manasevit . | |
| 4,369,031 | 1/1983 | Goldman et al. . | |
| 4,422,888 | 12/1983 | Stutius . | |
| 4,509,456 | 4/1985 | Kleinert et al. . | |

Primary Examiner—Richard Bueker
Attorney, Agent, or Firm—Marvin Snyder; Harley R. Ball

[57] ABSTRACT

An apparatus for the treatment of a substrate with two or more gases includes a reaction chamber with an outlet and an inlet, and a gas introduction manifold comprising a closed hollow body with a cylindrical interior. Feed ports, extending through a wall of the body, are integral with valves disposed about said body. An aperture extends through an end surface of the body which aperture is connected to the inlet of the chamber. The valves are disposed such that they are at equal distances from the center axis of the inlet.

9 Claims, 3 Drawing Figures

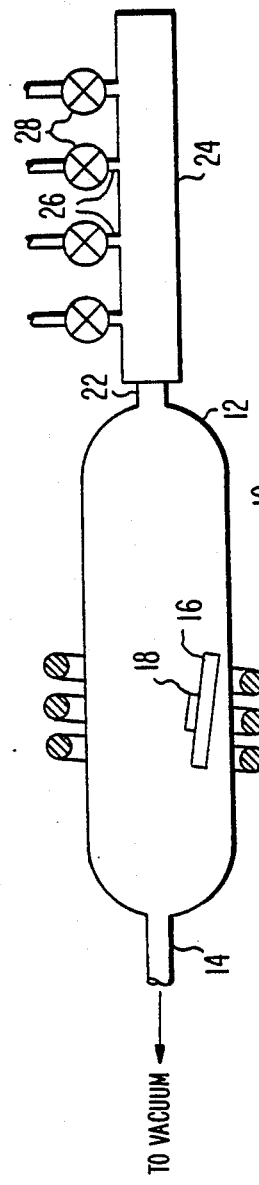
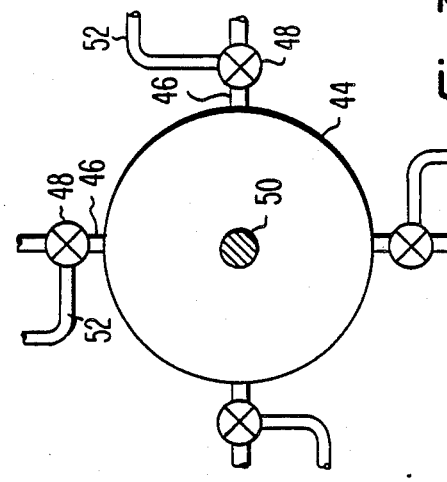
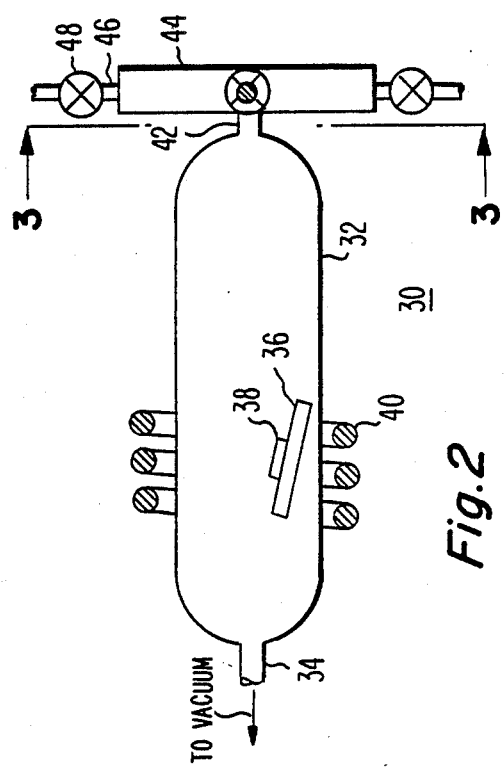

VAPOR DEPOSITION APPARATUS AND METHOD OF USING SAME

This invention relates to an apparatus for use in a vapor deposition process, and more particularly concerns a gas introduction manifold for such an apparatus.

BACKGROUND OF THE INVENTION

Vapor deposition processes are known for their use in the field of semiconductor devices. For example, metal organic chemical vapor deposition (MOCVD) has become an important process in the fabrication of semiconductor devices. MOCVD is a gaseous crystal growth technique in which compounds, e.g. trimethyl gallium (($CH_3$)$_3$Ga), are caused to react with other gases, e.g. arsine ($AsH_3$) and/or phosphine ($PH_3$), and appropriate dopants, in the vapor phase to produce single crystalline or polycrystalline deposits.

For many applications MOCVD is favored over traditional liquid phase epitaxy (LPE) techniques because MOCVD provides better control over the layer thickness, layer smoothness, and the abruptness of layer interfaces. The MOCVD process is further characterized by greater uniformity of crystal composition and doping profiles as compared to LPE.

Typically an MOCVD system comprises a reaction chamber integral with a linear series of valves for introducing the appropriate reagents into the chamber. A problem with such a system is that the valves are a distance from the substrate to be coated resulting in an inherent lag time during the switching of reagents while terminating the growth of a first layer and commencing the growth of a second. Also, some reagents are introduced by valves at a greater distance from the substrate than others which can cause compositional variations at the beginning and end of each layer. With the increasing need to fabricate devices containing thinner layers, these problems become more pronounced. Therefore, an improved MOCVD apparatus has been sought.

SUMMARY OF THE INVENTION

An apparatus for the treatment of a substrate with two or more gases includes a reaction chamber with an outlet and an inlet, and a gas introduction manifold comprising a closed hollow body with a cylindrical interior. Feed ports, extending through a wall of the body, are integral with valves disposed about said body. An aperture extends through an end surface of the body which aperture is connected to the inlet of the chamber. The valves are disposed such that they are at equal distances from the center axis of the inlet.

BRIEF DESCRIPTION OF THE DRAWING

FIG. 1 illustrates an apparatus of the prior art.
FIG. 2 illustrates an apparatus of the invention.
FIG. 3 illustrates an end view of the gas introduction manifold of the invention.

DETAILED DESCRIPTION OF THE PREFERRED EMBODIMENTS

An MOCVD system 10 of the prior art as shown in FIG. 1, comprises a chamber 12, including an outlet 14 for the exhaust of gases. The outlet 14 may be connected to a vacuum means (not shown) for evacuating the chamber 12. Within the chamber 12 is a support means 16 holding a substrate 18 to be coated. A coil 20 around the chamber 12 in the area of the substrate 18 initiates the reaction of the gases to be introduced. The chamber 12 is also provided with an inlet 22 connected to a linear manifold 24. The manifold 24 includes ports 26 and valves 28 for each reagent or gas to be introduced.

In the operation of the prior art system 10, the chamber 12 may be evacuated through the outlet 14 depending upon whether the system 10 is to be operated at reduced or atmospheric pressure. Gases appropriate to grow a desired layer in the substrate 18 are introduced through the valves 28. The coil inductively heats the support means 16 and thereby substrate 18. Pyrolysis of the gases and recombination of the generated species at the site of the heated substrate 18 characterize the growth mechanism. It can be appreciated that in using the prior art system 10, the transit time, or time from the opening of a valve 28 to the arrival of the reagent at the substrate 18, differs among the reagents from the various valves 28. Also, for those valves 28 which are furthest removed from the chamber 12, a longer transition time is needed to change from one layer to the next. Longer transition times adversely affect the abruptness imparted to the layer interface. Also, since the reagents are introduced normal to, and at differing points along the manifold 24, there is little or no impinging of one reagent upon the other which can result in insufficient mixing.

The MOCVD apparatus 30 of the present invention is shown in FIG. 2 comprising a chamber 32 with an outlet 34 for the exit of gases. The vacuum means may be supplied depending on whether the deposition process is to be carried out at reduced or atmospheric pressure. The support means 36 supports the substrate 38. A coil 40 is disposed around the chamber 32 and is connected to a power supply (not shown). The coil 40 inductively heats the support means 36 and substrate 38. Alternatively, other means may be employed to heat the substrate 38, e.g. quartz lamps surrounding the chamber 32. The chamber 32 is also provided with an inlet 42 connected to the gas introduction manifold 44 of the invention. The manifold 44 comprises a closed, hollow body with a cylindrical interior. Feed ports 46 extend through the peripheral sidewall thereof into the interior of the manifold 44. Valves 48, integral with the feed ports 46, are further connected to the various reagent gas supplies (not shown). The valves 48 are disposed at equal distances from the inlet 42.

FIG. 3 represents an end view of the manifold 44. It can be seen that the feed ports 46 and valves 48 are radially disposed along the sidewall of the manifold 44. An aperture 50 located in the center of one end wall of the manifold 44 is provided such that when the manifold 44 is juxtaposed the chamber 32 as in FIG. 2, the inlet 42 and aperture 50 are aligned with, and connected to, each other. Carrier gas feed lines 52 are shown on each port 46 and should be near or integral with the valves 48.

The chamber 32 is typically formed of quartz. The support means 36 may be a susceptor, i.e. body for holding a substrate which is capable of absorbing heat from a source and conducting the heat to the substrate. The source may be radio frequency or radiant heating. When employed in this manner, the support means 36 is typically of graphite. The substrate 38 has been described as a semiconductor substrate onto which layers of crystalline material are to be deposited. However, the substrate may be any workpiece to be treated by the reagent gases introduced into the system. The manifold 44 and feed ports 46 should be of a material not susceptible to attack by the reagents, e.g. stainless steel. The cylindrical interior of the manifold 44, defined by a sidewall and two end walls, can have any dimensions, but preferably is provided to have a distance between the interior end walls less than about one half the diameter of one of those end walls. The outside of the manifold 44, shown also to be cylindrical in FIGS. 2 and 3, can have any outside shape and dimensions as long as the valves 48 are equidistant from the center axis of the inlet 42. Also, the aperture 50 can be located in any position on the end surface, however, central location is preferred. Further, the aperture 50 and inlet 42 need only be connected, but axial alignment of these elements is preferred. The aperture 50 and inlet 42 may have a diameter smaller than the diameter of the chamber 42 or may have a diameter equal to the chamber 32. While the valves are shown in the FIGURES to be radially disposed about the manifold 44 with the feed ports extending through the peripheral sidewall thereof, the valves can be disposed anywhere about the manifold 44 provided they are equidistant from the inlet 42. Accordingly, the feed ports 46 may extend through the end walls of the manifold. In this case means may be provided for directing the gases introduced toward the inlet 42.

Referring back to FIG. 3, it can be appreciated that as reagent gases enter the manifold 44 via the valves 48 and feed ports 46, they will impinge upon each other in the area of the aperture 50 resulting in a more efficient mixing of the gases just before they are introduced into the chamber 32 through the aperture 50 and inlet 42. When two or more gases are used to deposit a layer, the gas mixing can be further enhanced by providing that the valves 48 are symmetrically disposed around the manifold 44. Also, regardless of how many valves 48 are incorporated into the manifold 44, all valves 48 will be an equal distance from the center axis of the inlet 42. This provides an equalized transit time for all reagents resulting in greater compositional uniformity, especially at the beginning and end of the growth of each layer. Further, since all of the valves 48 are closer to the chamber 32, i.e. as opposed to some of the more remote valves 28 shown in FIG. 1, the transition time is reduced and is more uniform for all valves 48. Thus, regardless of which two or more valves 48 are used to grow a layer on the substrate 38, the transition time to any other two valves to grow a subsequent layer will be minimized and constant. This in turn, results in better control of the abruptness of the layer interfaces. To further enhance the minimization of the transition time between layers, a carrier gas, i.e. a gas to enhance the flow which does not actually take part in the reaction, can be introduced by a gas feed line 52 along the feed port 46 or preferably through the valve 48. This gas can be left constantly flowing, even when the valve 48 for a particular reagent is closed. In this way when the valve 48 is opened, the reagent will be more rapidly advanced into the manifold 44 and chamber 32 by the already-flowing carrier gas. Further, the increased gas flow provided by the use of a carrier gas between the valve 48 and manifold 44 enhances mixing within the manifold 44 when two or more reagents are introduced.

Although the present invention has been described with respect to an MOCVD system, it should be noted that any apparatus for the treatment of a workpiece by two or more gases would be improved by the concepts described herein.

I claim:

1. In an apparatus for the treatment of a substrate with two or more gases, which apparatus comprises:
   a reaction chamber including means for supporting said substrate;
   means for introducing two or more gases into said chamber through an inlet; and
   outlet means for exhausting said gases from said chamber;
   the improvement wherein said gas introduction means is a manifold comprising a closed hollow body having no reaction means therein; said body having a cylindrical interior defined by a peripheral sidewall and two end walls; and having feed ports extending through a wall of said body, which feed ports are integral with valves disposed about said body; and having an aperture extending through an end wall of said body; said body being juxtaposed said chamber such that the inlet of said chamber is connected to said aperture, and further wherein said aperture has a center and said valves are equidistant from the center of said aperture.

2. The apparatus of claim 1 wherein said aperture is centrally located in said end surface.

3. The apparatus of claim 2 wherein said aperture is axially aligned with said inlet.

4. The apparatus of claim 1 wherein the cylindrical interior has a distance between said end walls less than about one-half of the diameter of one end wall.

5. The apparatus of claim 1 wherein the valves employed to introduce said gases are symmetrically disposed around said body.

6. The apparatus of claim 1 further comprising a carrier gas feed line interposed between said valve and manifold whereby a constant flow of inert carrier gas is provided into the feed ports between the manifold and the valves.

7. The apparatus of claim 1 wherein said feed ports extend through said peripheral sidewall.

8. The apparatus of claim 1 wherein said body is cylindrical.

9. The apparatus of claim 1 wherein said valves are radially disposed around said body.

* * * * *